United States Patent [19]

McGuire

[11] Patent Number: 5,475,892
[45] Date of Patent: Dec. 19, 1995

[54] SEMICONDUCTOR WAFER PARTICLE EXTRACTOR

[75] Inventor: Mark A. McGuire, Coppell, Tex.

[73] Assignee: Texas Instruments Incorporated, Dallas, Tex.

[21] Appl. No.: 144,944

[22] Filed: Oct. 29, 1993

[51] Int. Cl.⁶ ........................................ A47L 5/38
[52] U.S. Cl. ........................... 15/310; 15/311; 414/433; 414/757
[58] Field of Search .................. 15/311, 310; 414/433, 414/757, 936, 938

[56] References Cited

U.S. PATENT DOCUMENTS

| | | |
|---|---|---|
| 3,004,276 | 10/1961 | Hoffman .................. 15/310 X |
| 3,005,223 | 10/1961 | Taylor et al. .............. 15/310 |
| 3,150,401 | 9/1964 | Taylor et al. .............. 15/311 |
| 3,345,075 | 10/1967 | Phillipson et al. ....... 15/310 X |
| 3,479,222 | 11/1969 | David et al. ............. 15/302 X |
| 3,765,051 | 10/1973 | Wanat ..................... 15/310 X |
| 4,662,811 | 5/1987 | Hayden ....................... 414/433 |
| 4,750,505 | 6/1988 | Inuta et al. ............. 15/310 X |
| 5,054,988 | 10/1991 | Shiraiwa ................ 414/938 X |

*Primary Examiner*—Chris K. Moore
*Attorney, Agent, or Firm*—Robby T. Holland; Wade James Brady, III; Richard L. Donaldson

[57] ABSTRACT

An alignment apparatus for aligning the flat edges on semiconductor wafers has a roller 13 used to turn the wafers 12 during alignment. The roller 13 is hollow and has a plurality of holes 14 in the surface of the roller though which a vacuum is drawn to remove particle contaminates from and around the semiconductor wafers.

9 Claims, 3 Drawing Sheets

SEMICONDUCTOR WAFER PARTICLE EXTRACTOR

FIELD OF THE INVENTION

The invention relates to semiconductor device processing apparatus, and more particularly to an apparatus and method for removing silicon particles from semiconductor wafers during wafer flat alignment.

BACKGROUND OF THE INVENTION

During semiconductor wafer processing, it is necessary to locate and align the flat edges of the wafers in the wafer cassette to enable automated equipment to process the wafers and provide the proper wafer alignment during processing. A flat finder apparatus is used to align as many as twenty-five semiconductor wafers in a cassette or wafer boat. Flat finders are needed in almost every step in the manufacturing process, which can be a many as 170 different steps.

Wafer flats are located by placing a number of wafers in a flat locator and rotating the wafers until all the flats are aligned. During the rolling and alignment process, particles of silicon or other material resulting from surface and edge polishing, and other processing steps adhere to the surface and edges of the wafers. These particles lead to device defects if they are not removed.

SUMMARY OF THE INVENTION

The invention is to an apparatus for removing particles from semiconductor wafers which is used in conjunction with and forming part of a flat alignment apparatus. The apparatus is a roller used on a flat alignment apparatus. The roller, which is used to turn the semiconductor wafers during flat aligning, is cylindrical in shape and has perforations around its outer surface through which a vacuum is pulled to pull loose particles, and particles from the surface and edges of the wafers into the cylinder for disposal.

As the wafers are aligned, the roller turns on bearings and the vacuum is pulled through a rotating joint that connects the roller to the vacuum source. Roller may be turned by hand, or connected to a motor used with automatic wafer aligners.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
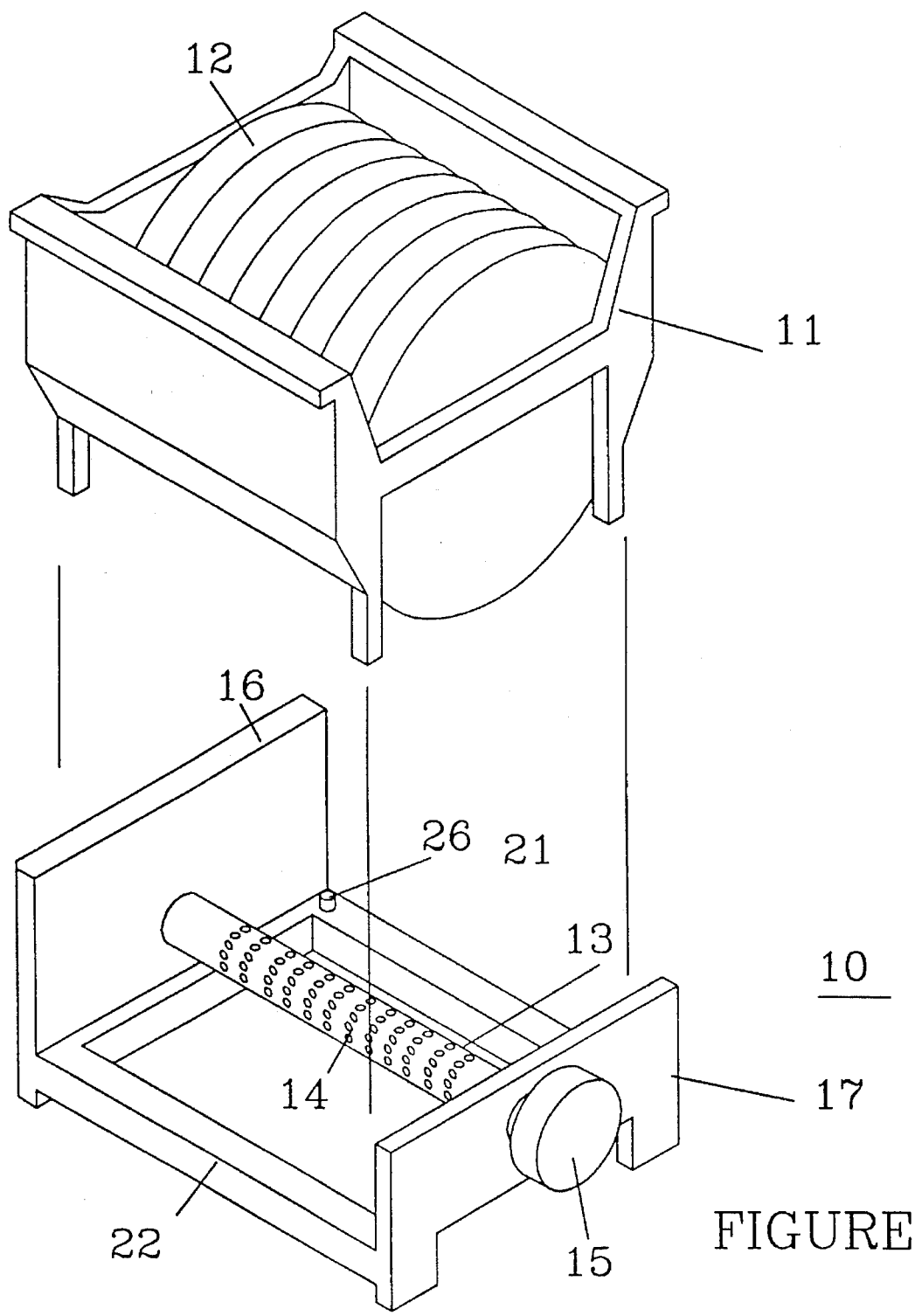
FIG. 1 illustrates a typical wafer aligner with a vacuum roller.

FIG. 1 illustrates a flat alignment apparatus 10 positioned under a semiconductor wafer cassette 11. Aligner 10 includes a frame having ends 16 and 17 connected by side rails 21 and 22. Wafer cassette 11 is positioned on aligner 10 and positions wafers 12 on roller 13. Knob 15 turns roller 13 which in turn rotates wafers 12 during alignment. Roller 13 is shown with openings 14 around the surface of the roller which extend through the roller wall into the center opening in the roller. A vacuum is drawn in roller 13 through openings 14.

A sensor switch 26 on frame 21 is for applying or starting the vacuum when a cassette of wafers is mounted on the aligner frame.

Figure 2:
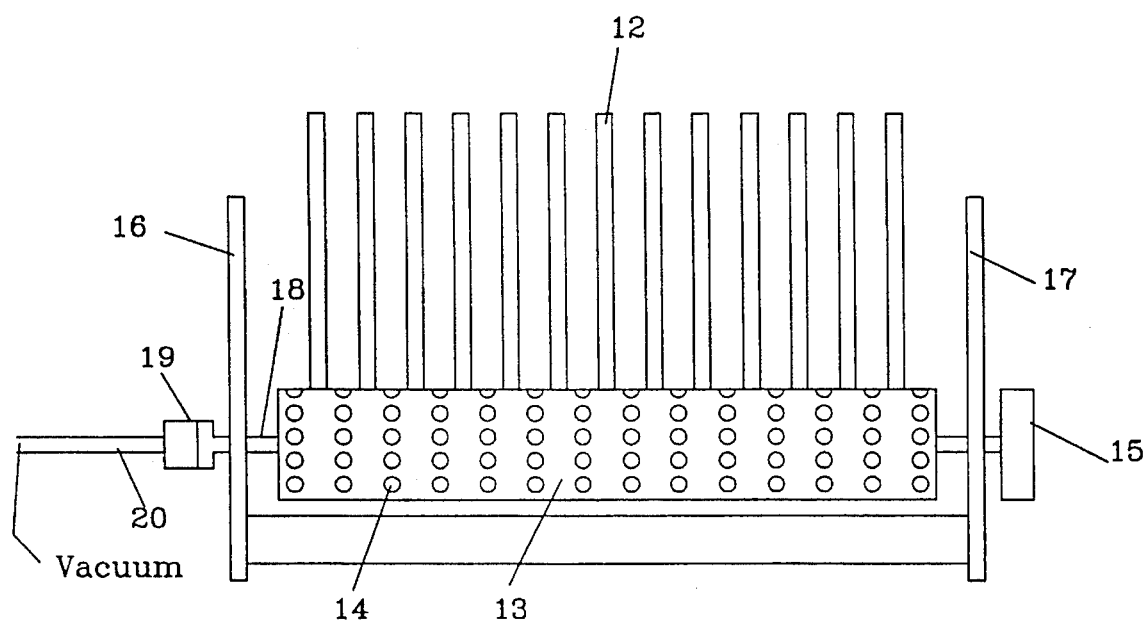
FIG. 2 is a side view, in part, showing the wafers on the vacuum port roller.

FIG. 2 is a side view of aligner 10, showing the location of the wafers on roller 13. The wafer cassette is not shown. Roller 13 is mounted on hollow shaft 18 which extends through end plates 16 and 17, mounting roller 13, and permitting roller 13 to freely rotate on shaft 18. Attached to shaft 18 a rotating seal-joint 19, attaching shaft 18 to vacuum line 20. As roller 13 rotates, wafers 12 also rotate for aligning the wafer flats. A vacuum is drawn through line 20 and shaft 18 drawing air into openings 14 in roller 13. As wafers 12 rotate, silicon particles and other contaminants fall from wafers 12 and are drawn into roller 13, removing the particle contaminants from the vicinity of the wafers. The drawn vacuum also helps to draw or "suck" contaminant particles from the wafers.

Figure 3:
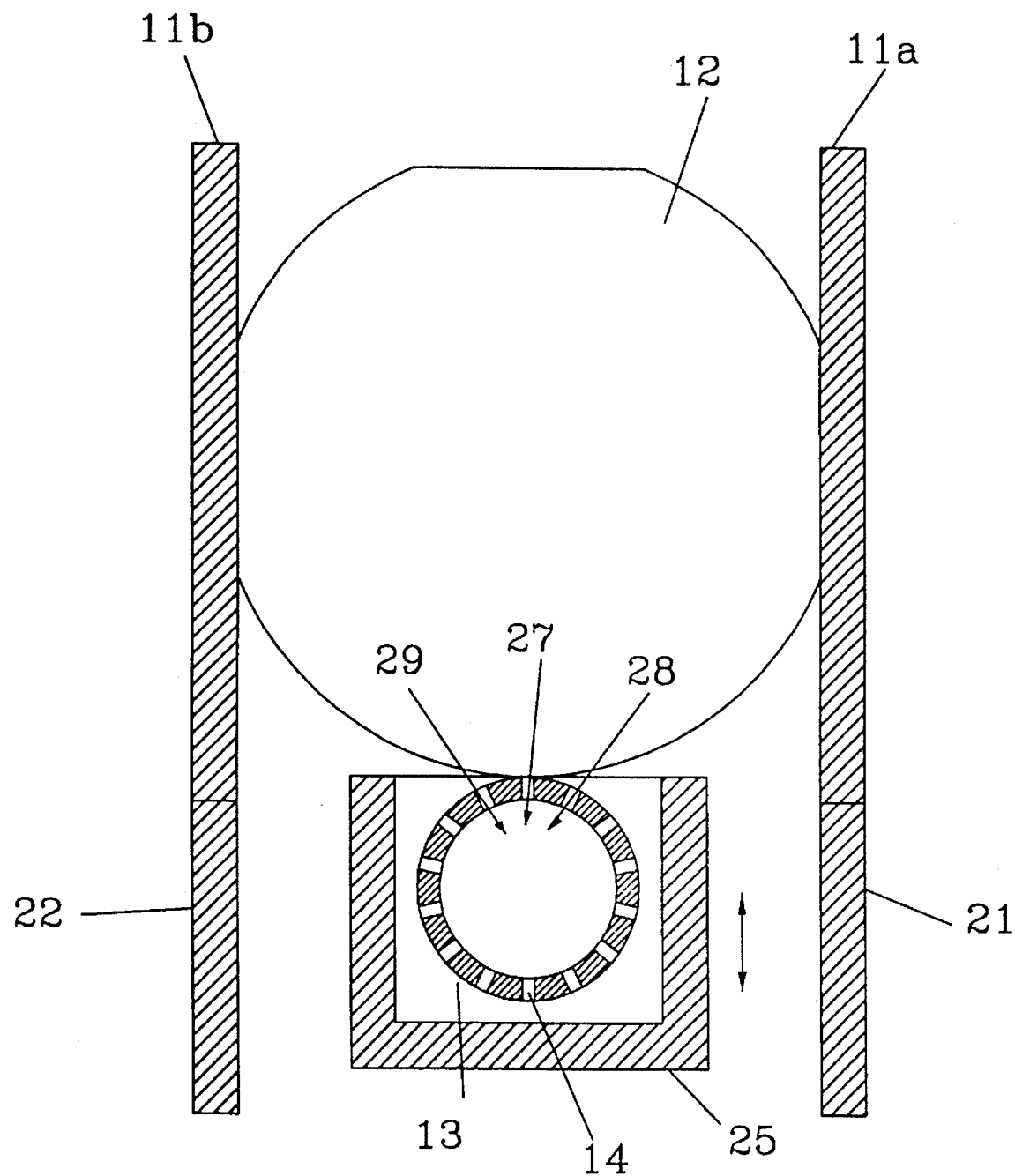
FIG. 3 is an end view, in part, showing the air and particle flow into the vacuum roller.

FIG. 3 is a cross-sectional view, in part, showing wafers 12 held between the walls 11a and 11b of cassette 11. Cassette 11 is positioned in the side rails 21 and 22 of aligner 10. Roller 13 is in rolling contact with wafers 12. Arrows 29, 27 and 28 show air flow into roller 13 through openings 14. Contaminant particles from wafers 12 are drawn into roller 13 through openings 14, removing the contaminant particles from the area around the wafers.

In operation, semiconductor wafers are loaded into wafer cassette 11. The cassette is placed on aligner 10 and roller 13 is turned until the flats of the wafers are over roller 13 and stop turning.

During the rotation of wafers 12, a vacuum is applied to shaft 18 which is connected (not shown) into the interior cavity of hollow roller 13. Air is drawn into roller 13, pulling contaminant particles into roller 13, removing the particles from the vicinity of the wafers.

The roller has been illustrated with a particular hole pattern placing a row of holes around the circumference of the roller at positions between the wafers. However, the hole pattern is not critical as long as air is drawn into the roller on each side of a wafer.

What is claimed:

1. An alignment apparatus for aligning the flat edges on semiconductor edges, comprising:

a frame for receiving a wafer cassette;

a hollow cylindrical roller mounted in said frame and positioned to be in rolling contact with the semiconductor wafers in said cassette;

a plurality of openings in said roller extending from an outer surface of said roller into the interior of said roller; and a vacuum line attached to said roller for pulling a vacuum through said plurality of openings into the interior of said roller.

2. The apparatus according to claim 3, including a rotating seal joint connecting the hollow shaft to said vacuum line.

3. The apparatus according to claim 1, wherein said roller is mounted on a hollow shaft, rotatably mounted in said frame.

4. The apparatus according to claim 1, wherein said plurality of openings are positioned on said roller adjacent to semiconductor wafers in rolling contact with said roller.

5. The apparatus according to claim 1, including a pressure switch sensing the placement of a cassette on the alignment device to apply the vacuum to the roller.

6. An alignment apparatus for aligning the flat edges on semiconductor edges, comprising:

a frame for receiving a wafer cassette;

a hollow cylindrical roller rotatably mounted on a hollow shaft in said frame, and positioned to be in rolling contact with the semiconductor wafers in said cassette;

a plurality of openings in said roller extending from an outer surface of said roller into the interior of said roller; and a vacuum line attached to said hollow shaft for pulling a vacuum through said plurality of openings into the interior of said roller.

7. The apparatus according to claim 6, wherein the vacuum line is attached to said hollow shaft by a rotating seal joint.

8. The apparatus according to claim 6, wherein said plurality of openings are positioned on said roller adjacent to semiconductor wafers in rolling contact with said roller.

9. The apparatus according to claim 6, including a pressure switch sensing the placement of a cassette on the alignment device to apply the vacuum to the roller.

* * * * *